United States Patent [19]
Yoshinaga et al.

[11] Patent Number: 5,886,403
[45] Date of Patent: Mar. 23, 1999

[54] SEALED RECTIFIER

[75] Inventors: Soichi Yoshinaga; Hitoshi Irie; Hiroaki Ishikawa, all of Nagoya, Japan

[73] Assignee: Denso Corporation, Kariya, Japan

[21] Appl. No.: 908,460

[22] Filed: Aug. 7, 1997

[30] Foreign Application Priority Data

| Aug. 8, 1996 | [JP] | Japan | 8-210216 |
| Nov. 28, 1996 | [JP] | Japan | 8-318207 |
| Mar. 14, 1997 | [JP] | Japan | 9-060953 |

[51] Int. Cl.⁶ .......... H02K 19/36; H01L 23/36; H01L 23/28; H01L 23/32
[52] U.S. Cl. .......... 257/688; 257/689; 257/658; 257/712
[58] Field of Search .......... 257/678, 666, 257/688, 689, 787, 692, 693, 712, 737, 778, 780, 785, 659, 796

[56] References Cited

U.S. PATENT DOCUMENTS

| 4,303,935 | 12/1981 | Ragaly | 257/724 |
| 4,328,512 | 5/1982 | Hayke et al. | 257/724 |
| 5,005,069 | 4/1991 | Wasmer et al. | 257/687 |
| 5,206,793 | 4/1993 | Boudrant et al. | 257/689 |
| 5,278,446 | 1/1994 | Nagaraj et al. | 257/707 |

FOREIGN PATENT DOCUMENTS

| 4103780 | 8/1992 | Germany | 257/796 |
| 52-112770 | 8/1977 | Japan . | |
| 56-129742 | 8/1982 | Japan . | |
| 1-157252 | 6/1989 | Japan . | |
| 2-126664 | 5/1990 | Japan | 257/658 |
| 3-44944 | 2/1991 | Japan | 257/688 |
| 3-209749 | 9/1991 | Japan . | |
| 4-196569 | 7/1992 | Japan . | |
| 7-120736 | 12/1995 | Japan . | |

Primary Examiner—Alexander Oscar Williams
Attorney, Agent, or Firm—Pillsbury Madison & Sutro LLP

[57] ABSTRACT

A sealed rectifier used in a vehicle alternator is composed of a semiconductor diode chip, a base electrode having a disk plate which has a central mount for supporting the chip and an annular wall extending higher than the central mount, a pole electrode having a flange connected to the other side of the chip and an insulating member covering the chip, base electrode and pole electrode. The thickness of the annular wall is smaller than the thickness of the central mount, the outer periphery of the disk plate has a serrated surface for mechanical connection with an cooling fin of the alternator, and the insulating member is composed of resinous material and inorganic filler material to provide residual internal pressure higher than the atmospheric pressure.

23 Claims, 8 Drawing Sheets

SEALED RECTIFIER

CROSS REFERENCE TO RELATED APPLICATION

The present application is based on and claims priority from Japanese Patent Applications 8-210216 filed on Aug. 8, 1996, 8-318207 filed on Nov. 28, 1996, and 9-60953 filed on Mar. 14, 1997, the contents of which are incorporated herein by reference.

BACKGROUND OF THE INVENTION

1. Field of the Invention

The present invention relates to a sealed rectifier for a vehicle which is used in a severe temperature condition.

2. Description of the Related Art

Sealed rectifiers employed in a vehicular alternator, which is mounted in the engine compartment, are subject to temperature changes caused by change in operating conditions of the alternator and the engine. The rectifiers used in such an alternator are required to rectify current amounting to 50–150 amperes (A). Therefore, it is necessary for each of the rectifiers to have wide contact areas connecting a plus-side electrode and the plus-side surface of a semiconductor diode chip and connecting a minus-side electrode and the minus-side surface of the diode chip.

In order to provide sufficient contact areas, a pole-shaped or cup-shaped solid conductive member made of copper, copper alloy or iron alloy is used for the electrode instead of a bonding wire. If such a pole-shaped or cup-shaped electrode made of copper alloy is soldered to the semiconductor diode chip made of silicon however, a big difference in the coefficient of linear expansion would come to an existence between the electrode and the chip. For example, coefficients of the linear expansion of copper and silicon are, respectively, 17 ppm/°C. and 3 ppm/°C.

If the rectifier having the above-stated electrode is used in a severe temperature condition, such as the ambient temperature changes cyclically and widely, the junction of the two members may crack sooner or later.

In order to prevent cracks due to the difference in the linear expansion between the two members, JP-B2-7-120736 proposes to insert an intermediate member made of a material having a medium coefficient of the linear expansion between the chip and the electrode.

However, the addition of the intermediate member increases resistance of the junction and temperature of the junction and, in turn, increases the production cost.

JP-A4-229639 proposes sealing of the chip and the electrode with an insulating member made of epoxy resin. The insulating member contracts after it cools down and applies a pressure to the junction in the direction perpendicular to the junction surface. This structure is intended to assure an electrical connection between the chip and electrode even if the junction cracks.

Although this structure can elongate the life of the rectifier to some extent, such pressure is not sufficient to assure the long time reliability of the rectifier for a vehicular alternator.

SUMMARY OF THE INVENTION

The present invention has an object of providing an improved sealed rectifier without increasing the production cost. According to a main feature of the improved rectifier, the insulating member has a residual internal pressure sufficient to hold the electrical connection between a semiconductor diode chip and electrodes.

According to the present invention, a sealed rectifier is composed of a semiconductor diode chip, a base electrode having a central mount and an annular wall, a pole electrode and an insulating member covering the chip, base electrode and pole electrode. The thickness of the annular wall is smaller than thickness of the central mount, outer periphery of the base electrode has a serrated surface, and the insulating member is composed of resinous material and inorganic filler material. The inorganic filler material gives the insulating member a sufficient internal pressure, and the mechanical connection by serrated surface ensures the electrical connection without soldering, which otherwise heats the insulating member higher than a glass transition temperature to reduce the internal pressure of the same. The term "glass transition temperature" used here is the temperature of the insulating member where the insulating member becomes soft like rubber.

The glass transition temperature of the insulating member is made higher than about 40° C. below a maximum temperature of the rectifier in use. It is more preferable that the glass transition temperature of the insulating member is higher than the maximum temperature of the rectifier in use. The insulating member has a coefficient of linear expansion smaller than the coefficient of linear expansion of the base electrode and the pole electrode.

Another object of the present invention is to provide an improved method of manufacturing a sealed rectifier. The method is composed of the following steps:

providing a base electrode having a central mount and an annular wall extending axially around the central mount, soldering one side of a semiconductor diode chip to the central mount, soldering a pole electrode to the other side of the semiconductor diode chip, molding the unitary assembly of the semiconductor diode chip, base electrode and pole electrode with an insulating material at a pressure much higher than the atmospheric pressure to retain the unitary assembly, and holding the same pressure until the insulating material becomes solid.

The insulating material is composed of resinous material such as multi-function group epoxy resin and inorganic filler material of more than 50 weight %.

BRIEF DESCRIPTION OF THE DRAWINGS

Other objects, features and characteristics of the present invention as well as the functions of related parts of the present invention will become clear from a study of the following detailed description, the appended claims and the drawings. In the drawings:

DETAILED DESCRIPTION OF THE PREFERRED EMBODIMENTS

First Embodiment

A rectifier according to a first embodiment is described with reference to FIGS. 1–4.

Figure 1:
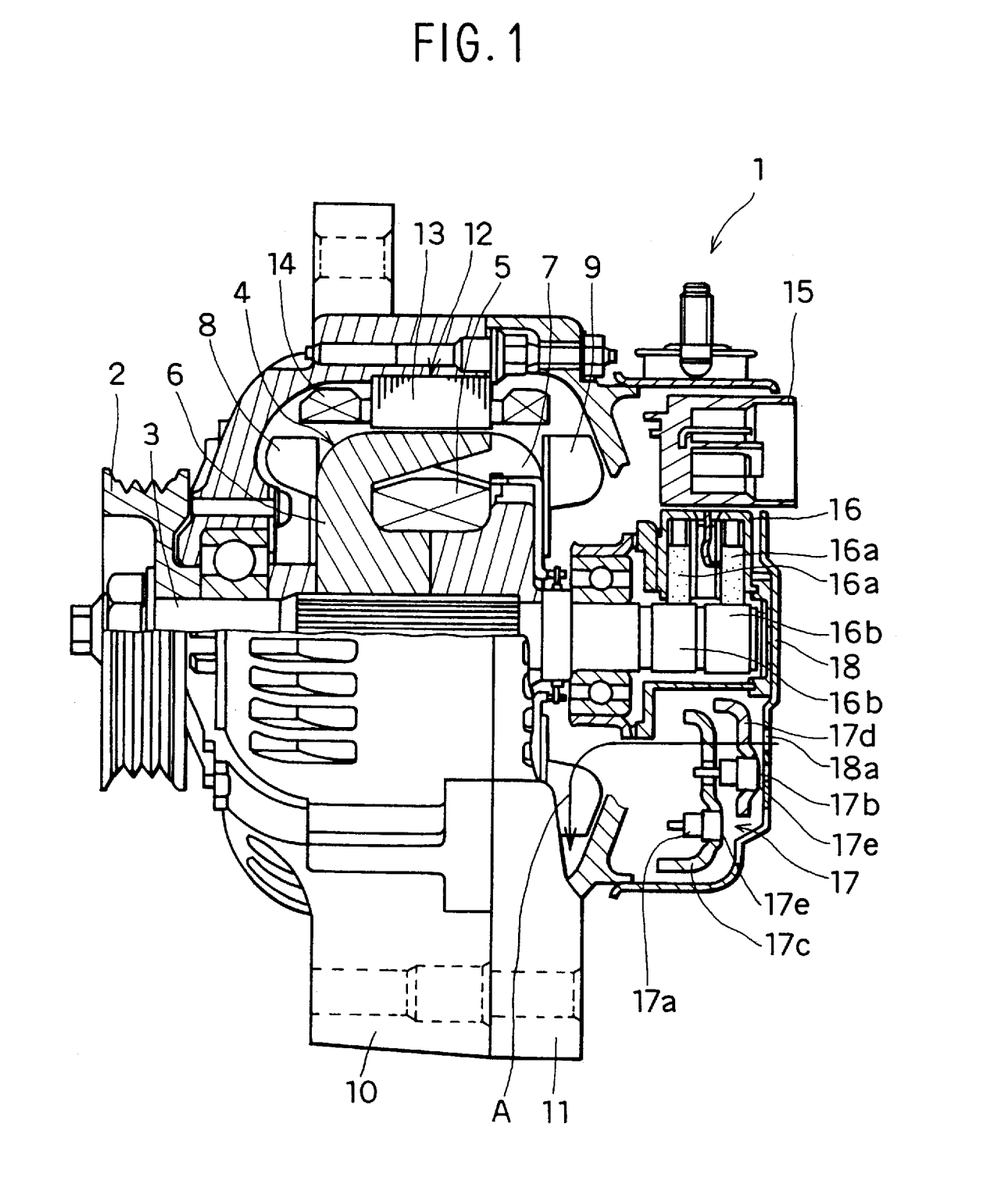
FIG. 1 is a cross-sectional view illustrating an alternator for a vehicle which has rectifiers according to an embodiment of the present invention.

An alternator 1 is mounted in the engine compartment of a vehicle and driven by an engine through a pulley 2. The pulley 2 is carried by a rotary shaft 3 of a rotor 4.

The rotor 4 is composed of a field coil 5, a pair of front and rear pole cores 6 and 7 each of which has a plurality of craw poles extending axially from one of the pole cores to the other, an axial cooling fan 8 which is welded to the front pole core 6 and a centrifugal cooling fan 9 which is welded to the rear pole cores 7.

The rotor 4 is rotatably supported by a drive frame 10 and a rear frame 11 and disposed in a stator 12 which has a stator core 13 and a plurality of stator coils 14.

A voltage regulator 15, a brush unit 16 having brushes 16a are fixed to the rear frame 11. A slip ring 16b is carried by a rear portion of the shaft 3 to supply field current from the brushes 16a to the field coil 5.

A rectifier unit 17 is fixed to the rear frame 11 and covered by a rear cover 18. The rectifier unit is composed of six rectifiers including a plus-side rectifier 17a and a minus-side rectifier 17b, an arc-shaped plus-side cooling fin 17c made of aluminum plate and an arc-shaped plus-side cooling fin 17c made of aluminum plate. The cooling fins 17c and 17d have three fixing holes (e.g. 17e in FIG. 2) respectively, so that the plus-side rectifier 17a with other two plus-side rectifiers is press-fitted to the plus-side cooling fin 17c, and so that the minus side rectifier 17b with other two minus-side rectifiers is press-fitted to the minus-side cooling fin 17d.

Figure 2:
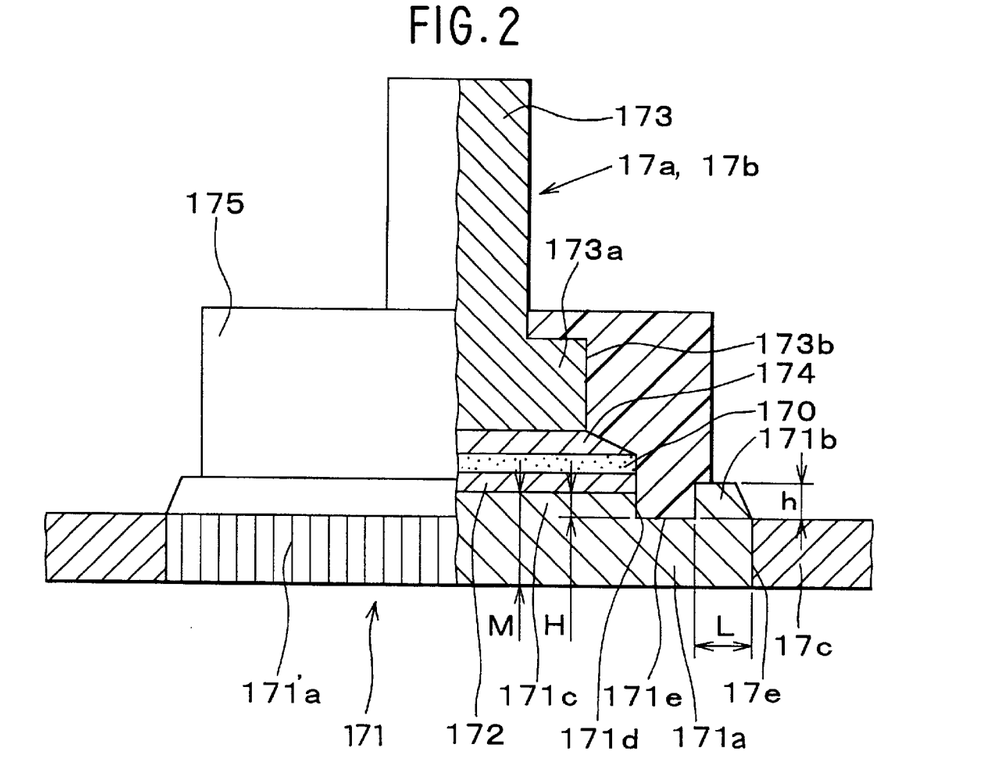
FIG. 2 is a cross-sectional view illustrating a rectifier according to a first embodiment of the present invention.

The structure of the plus-side rectifier 17a is substantially the same as structure of the minus-side rectifier 17b shown in FIG. 2. The rectifier 17a is composed of a circular or polygonal semiconductor chip 170 which is a silicon semiconductor diode element, a disk-like base electrode (hereinafter referred to as the base) 171 made of copper alloy or iron alloy and a flanged pole-shaped electrode (hereinafter referred to as the pole) 173.

The base 171 has a disk plate 171a, an annular wall 171b extending axially from the disk plate 171a, a central mount 171c extending from the disk plate 171a, and a bottom portion 171e on the disk portion between the annular wall 171b and the central mount 171c. The annular wall 171b is integrally formed around the central mount 171c at a distance of about 1 mm. The annular wall 171b can be formed separately. The height h of the annular wall from the bottom 171b is about 1.5 mm, so that the annular wall 171b becomes equal to or taller than the central mount 171c, which has a height H of about 1 mm from the bottom 171e. The annular wall 171b has a thickness L which is smaller than the axial thickness M of the central mount 171c. A serrated surface 171a' is formed as a mechanical connecting portion at a peripheral portion of the disk plate 171a lower than the mount 171e. The outer diameter of the serrated surface 171a' is slightly larger than the outer diameter of the annular wall 171b, and the serrated surface 171a' of the rectifier is press-fitted to one of the fixing holes 17e of the cooling fins 17c and 17d. The serrated surface can be omitted if the fixing hole of the cooling fins 17c and 17d are serrated or if the base is fixed to the cooling fins by screws.

It is important that the insulating member is not heated to a certain temperature which is described later.

The semiconductor chip 170 is soldered to the upper surface of the central mount 171c with solder 172 having the melting point of 300° C. The flange 173a of the flanged pole 173 is also soldered to the upper surface of the chip 170 with solder 174 having the same melting point.

An insulating member 175 covers the flange 173a of the pole 173 and the chip 170 without gaps and fills gaps between the central mount 171c and the annular wall 171b. The insulating member 175 is made of a resinous material such as epoxy resin including more than 50 weight % of inorganic filler material such as silica or alumina and is formed by a molding process to have a suitable internal residual pressure.

For example, the insulating member 175 has the following characteristics:

EXAMPLE 1

The coefficient of the linear expansion of the insulating member 175 including the filler material which has the glass transition temperature of 160° C. is 12 ppm/°C. at a temperature lower than 160° C. (the glass transition temperature) and 43 ppm/°C. at a temperature higher than 160° C., the modulus of elasticity of the same is about 12400 MPa at the ambient temperature of 25° C., and the thermal conductivity of the same at the same ambient temperature is 2.1 w/(m·°C.).

EXAMPLE 2

The coefficient of the linear expansion of the insulating material 175 including the glass filler which has the glass transition temperature of 206° C. is 12 ppm at a temperature lower than the glass transition temperature, and 38 ppm/°C. at a temperature higher than the glass transition temperature, the modulus of elasticity is about 12800 MPa at the ambient temperature of 25° C., and the thermal conductivity at the same ambient temperature is 2.9 w/(m·°C.).

EXAMPLE 3

The coefficient of the linear expansion of the insulating material 175 including the glass filler which has the glass transition temperature of 200° C. is 18 ppm at a temperature lower than the glass transition temperature, and 47 ppm/°C. at a temperature higher than the glass transition temperature, the modulus of elasticity is about 12600 MPa at the ambient temperature of 25° C., and the thermal conductivity at the same ambient temperature is 2.9 w/(m·°C.).

The coefficient of the linear expansion of the insulating member at a temperature lower than the glass transition temperature is almost equal to or slightly larger than the coefficient of the base 171 and the pole 173 both of which are made of copper alloy.

Accordingly, the linear expansion of the insulating member generates fastening force, mainly, in the radial or transversal direction as the ambient temperature rises, so that the thermal expansion of the electrode and solder can be suppressed. In other words, similarity in the coefficient of the linear expansion makes the insulating material adhere to the electrodes closely, and the coefficient being slightly larger increases the fastening force as stated above.

Figure 3:
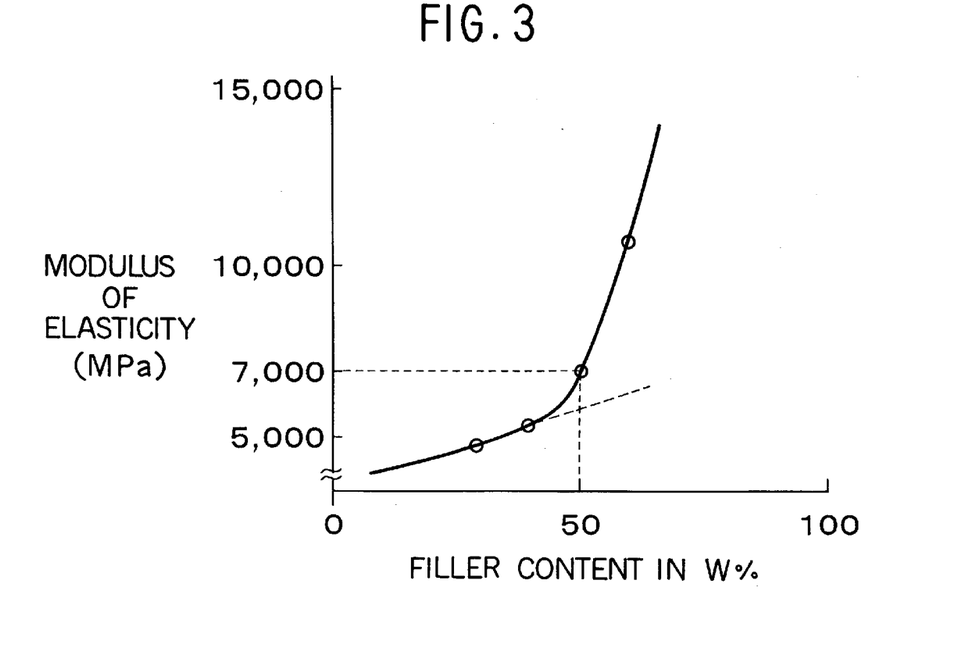
FIG. 3 is a graph showing a relationship between filler content and the modulus of elasticity of an insulating member of a rectifier.

In order to provide the internal residual pressure, the unitary assembly of the chip 170, the base 171 and the pole 173 is put in a molding die and fill the gap between the assembly and the internal surface of the die with the liquid resinous material including the inorganic filler material such as glass at a suitable pressure (e.g. 7 MPa) which is higher than the atmospheric pressure and at temperature of about 175° C. The pressure is maintained until the resinous material becomes solid. The inorganic filler material is added to increase the modulus of elasticity of the insulating member. The modulus of elasticity of the insulating member increases significantly as the percentage of the inorganic filler material such as glass becomes 50% or more as shown in FIG. 3. In order to secure a sufficient fluidity for the molding, the percentage of the filler material should be no more than 90%.

Thus, the insulating material 175 generates residual compressive pressures between the annular wall 171b and the mount 171c and between the annular wall 171b and the outer periphery 173b of the flange 173a. The compressive pressures suppress free-expansion of the two electrodes so that difference in the thermal expansion between chip 170 and the electrodes 171 and 173 can be reduced and, in turn, the thermal strain of the solder can be controlled.

The annular wall can be modified to some polygonal wall such as hexagonal or square wall.

Because the thickness L of the annular wall 171b is smaller than, e.g. ½–⅙ of, the thickness M of the central mount as described before, the annular wall first bends or expands if the ambient temperature rises and the residual pressure becomes excessively high, so that the semiconductor chip disposed on the central mount may be prevented from the bending stress, which is otherwise detrimental to the characteristic of the chip.

The serrated surface 171a is effective to connect the rectifier to a cooling fin without soldering, which may otherwise give thermal stresses to the chip 170, the base 171, the pole 173 and heat the insulating member 175 above its glass transition temperature to, thereby, decrease the retaining force of the insulating member.

Figure 4:
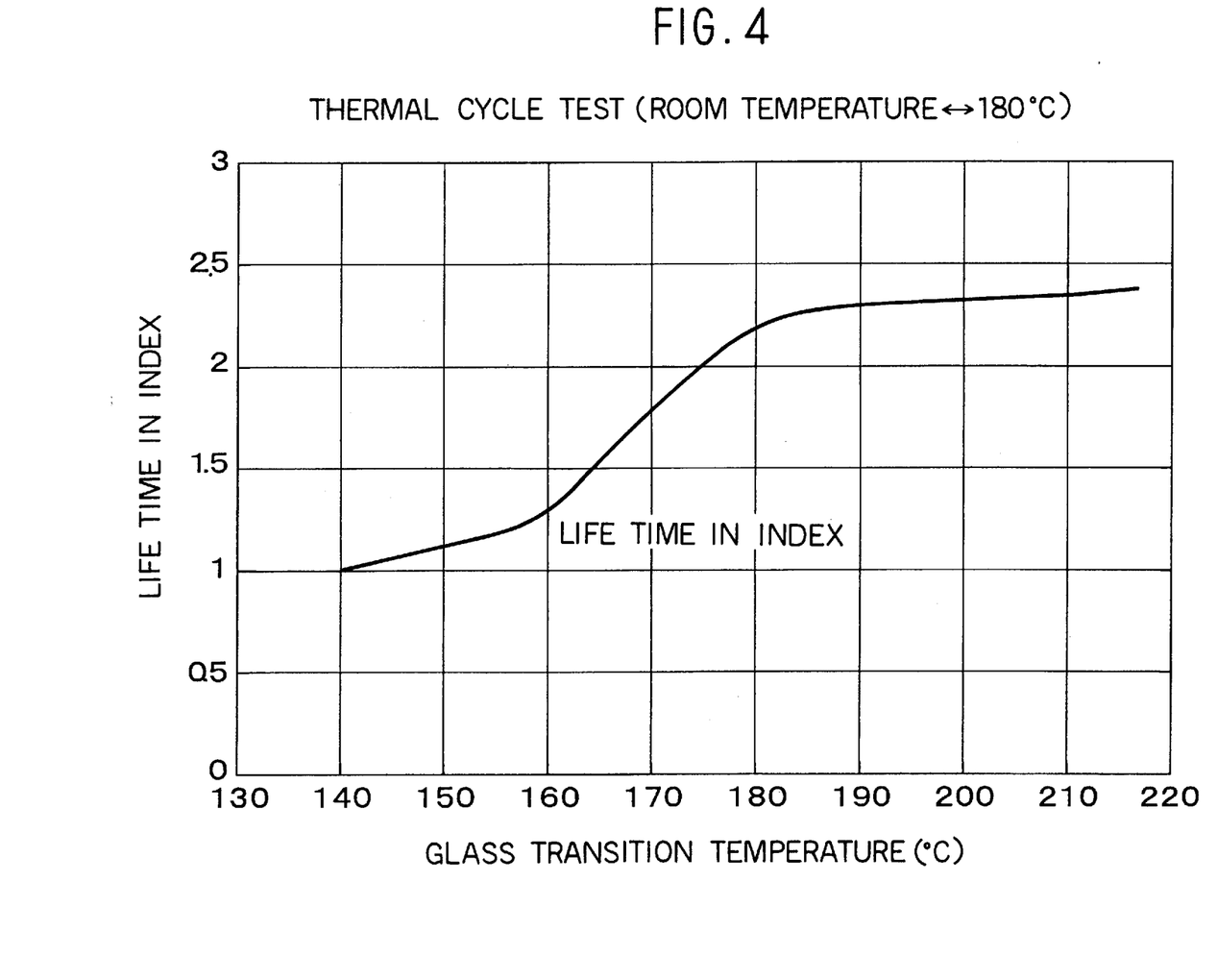
FIG. 4 is a graph showing a relationship between the glass transition temperature of the insulating member and the life of the rectifier after thermal cycle tests.
Figure 6:
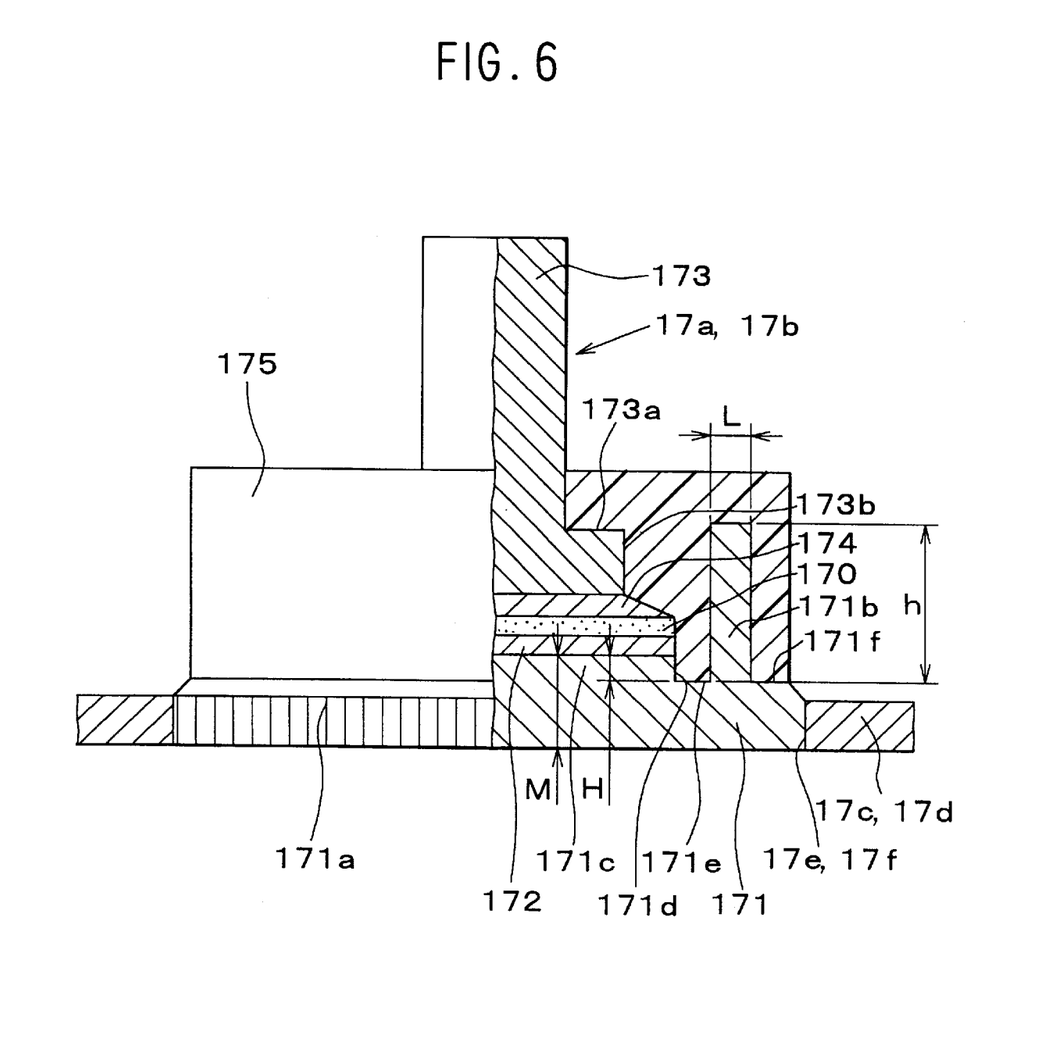
FIG. 6 is a cross-sectional view illustrating a rectifier according to a third embodiment of the present invention.

For instance, according to a test result shown in FIG. 4, the life of the rectifier is affected by the glass transition temperature of the insulating member when a cooling and heating cycle is repeated. It is noted in FIG. 4 that the life of the rectifier is increased as the glass transition temperature becomes higher and that the life is increased drastically (about 2.2 times as long as the life of the rectifier having the insulating member whose transition temperature is 140° C.) if the glass transition temperature becomes higher than the maximum ambient temperature (180° C.). As shown in FIG. 6, as the glass transition temperature of the insulating material 175 increases, the life time can be increased. As the glass transition temperature increases, the modulus of elasticity does not lowers very much even under a high temperature, thereby holding the residual internal pressure.

It is also noted that the life of the rectifier can be assured even if the glass transition temperature of the insulating member is a little lower, e.g. 40° C. lower, than the maximum ambient temperature, e.g. 180° C. The modulus of elasticity falls steeply when the temperature becomes higher than the glass transition temperature, and has a high and stable area, a transition area where the elasticity falls steeply and a low elasticity area. The transition area has a width of about 40° C. That is, even if the glass transition temperature is 40° C. below the ambient temperature, the residual internal pressure does not reduce much and can suppress the thermal expansion of the base 171 and the pole 173.

One sealed rectifiers are disposed so that the base 171 faces the upstream side of the cooling air and other sealed rectifiers are disposed so that the pole 173 is in the downstream side. Therefore, the pole and the insulating material 175 can be protected from salt water or the like contained in the cooling air. The serrated surface 171a' is not formed around the chip 170 so that the chip may be protected from the stress generated when the rectifier is press-fitted to the fixing hole 17e of the cooling fin 17c. The outer periphery of the annular wall 171b is exposed to cooling air directly to cool the base additionally.

Second Embodiment

A rectifier according to a second embodiment is described with reference to FIG. 5.

The base 171 of the rectifier according to the second embodiment has the annular wall 171b which extends axially to cover or surround the flange portion 173a and the whole outer periphery of the insulating member 175, which is filled in a manner substantially the same as the first embodiment.

The residual stress of the insulating member 175 has an effect on the pole 173 to keep the same in tight contact with the chip 170 even if the ambient temperature changes widely.

The annular wall 171b provides more effective cooling effect than that of the first embodiment.

Third Embodiment

A rectifier according to a third embodiment is described with reference to FIG. 6.

The insulating member 175 covers the annular wall 171b to provide tighter sealing effect as well as increased insulation effect. The annular wall extends axially to cover the flange 173a as the same in the second embodiment.

Fourth Embodiment

Figure 7:
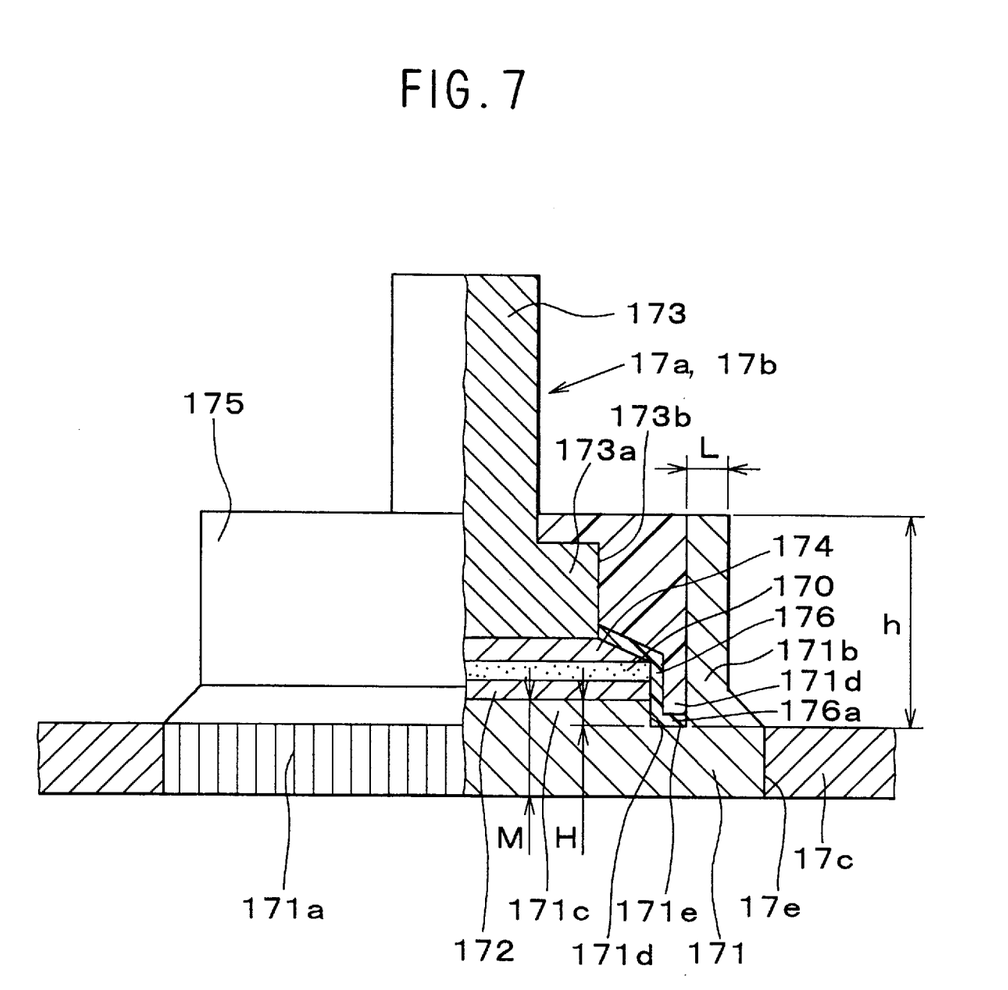
FIG. 7 is a cross-sectional view illustrating a rectifier according to a fourth embodiment of the present invention.

A rectifier according to a fourth embodiment of the present invention is described with reference to FIG. 7.

A thin layer 176 of insulating material is formed around the semiconductor chip 170 and connecting portions of the central mount 171c and the flange 173a. A brim 176a of the thin layer 176 covers the bottom portion 171e inside the base 171. The layer 176 is effective in more complete water proofing to enhance the insulation of the rectifier. The thickness of the brim 176a is much smaller than the height H of the central mount so as to hold the residual pressure of the insulating member 175. The layer 176 is made of a material of the imido group and coated around the chip 170 of the unitary assembly before molding of the insulating material, which is described before. It is convenient to form the thin layer 176 if the height h of the annular wall is close to the height H of the central mount 171c.

Fifth Embodiment

Figure 8:
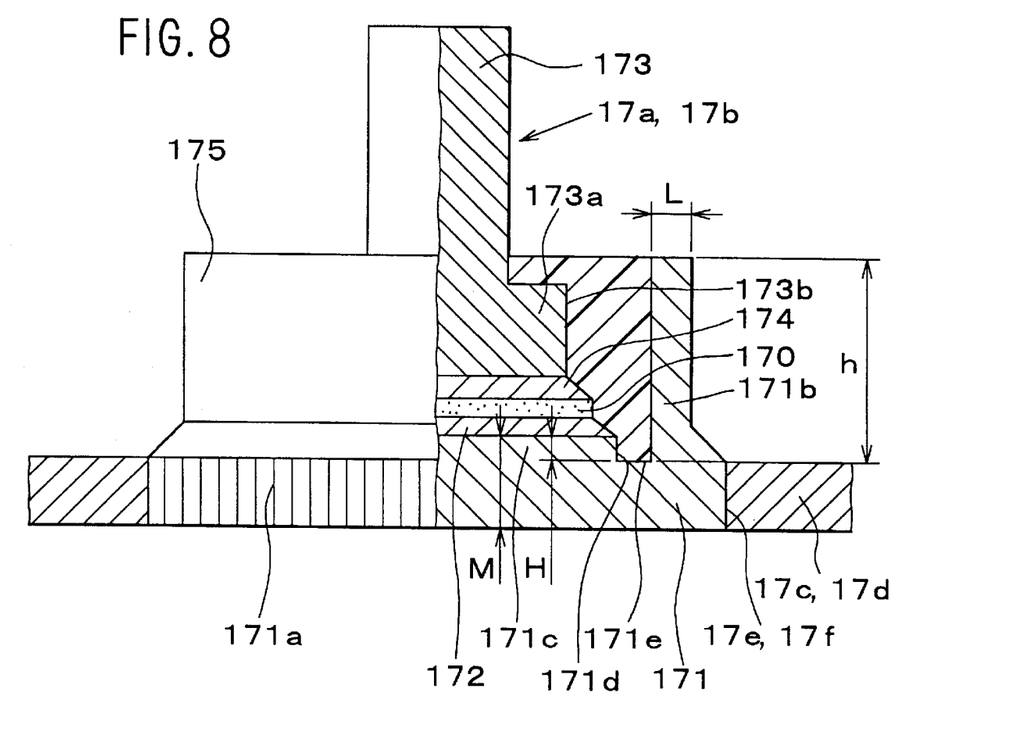
FIG. 8 is a cross-sectional view illustrating a rectifier according to a fifth embodiment of the present invention.

A rectifier according to a fifth embodiment of the present invention is described with reference to FIG. 8. The outside diameter of the central mount 171c is larger than the outside diameter of the semiconductor chip 170, which is larger than the outside diameter of the flange 173a of the pole 173.

Thus, no undercut is formed so that separating force between the semiconductor chip and the mount 171c is eliminated.

Sixth Embodiment

Figure 9:
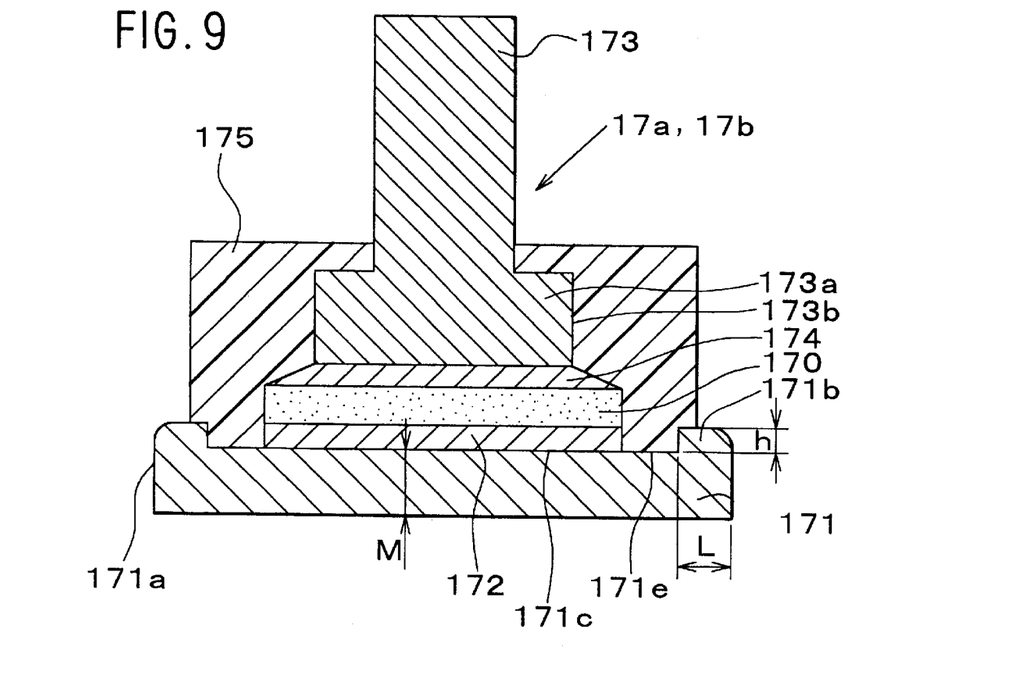
FIG. 9 is a cross-sectional view illustrating a rectifier according to a sixth embodiment of the present invention.

A rectifier according to a sixth embodiment is described with reference to FIG. 9.

The central mount 171c of this rectifier is level with the bottom portion 171e. The residual pressure is exerted mainly on the pole 173 against the semiconductor chip 173 and the base 171, which is simpler than that of the former embodiments.

Seventh Embodiment

Figure 10:
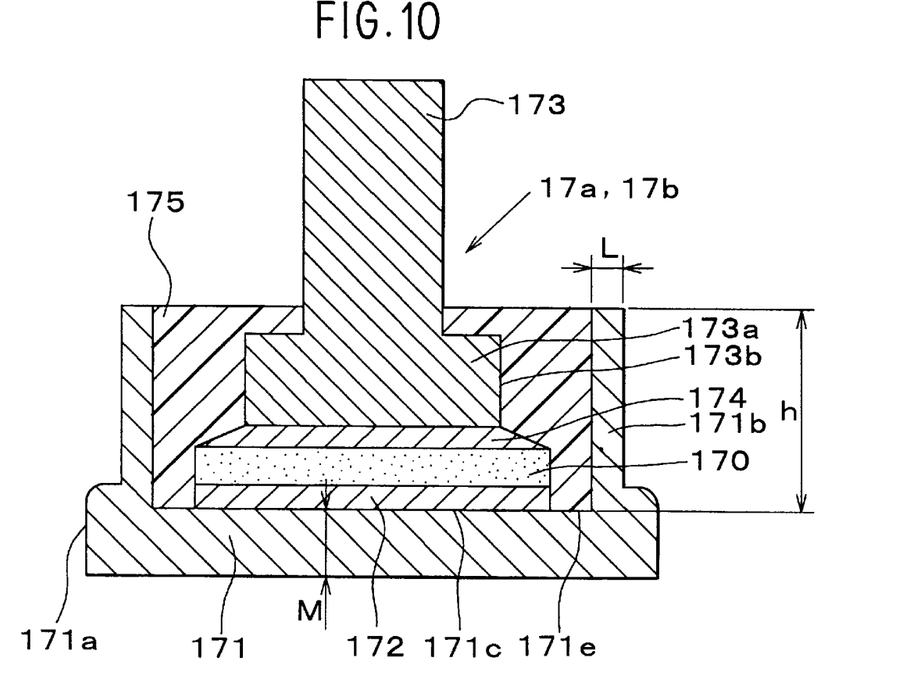
FIG. 10 is a cross-sectional view illustrating a rectifier according to a seventh embodiment of the present invention.

A rectifier according to a seventh embodiment is described with reference to FIG. 10.

Figure 5:
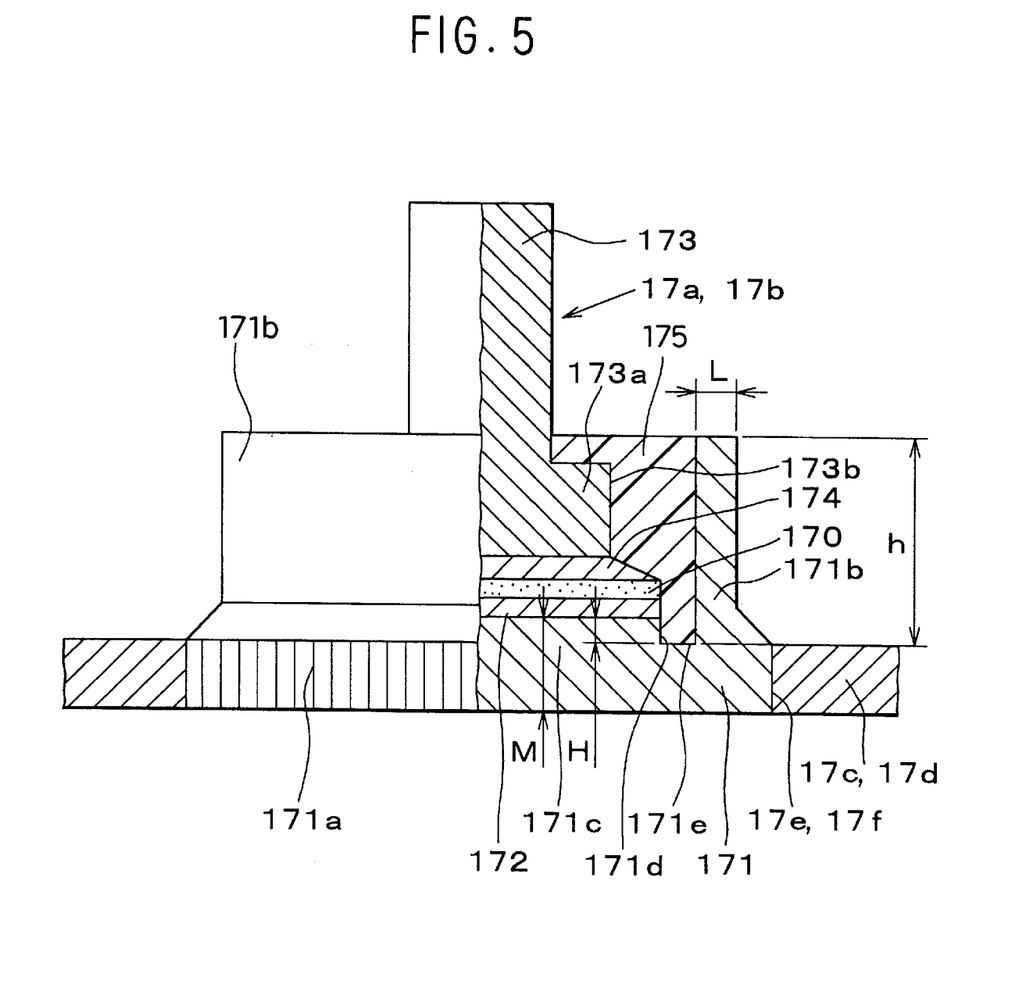
FIG. 5 is a cross-sectional view illustrating a rectifier according to a second embodiment of the present invention.

The annular wall 171b is extended axially to cover the flange 173a like the second embodiment shown in FIG. 5. The residual stress of the insulating member 175 effects on the pole 173 to keep the same in tight contact with the chip 170 even if the ambient temperature changes widely, and the annular wall 171b provides more effective cooling effect.

Eighth Embodiment

Figure 11:
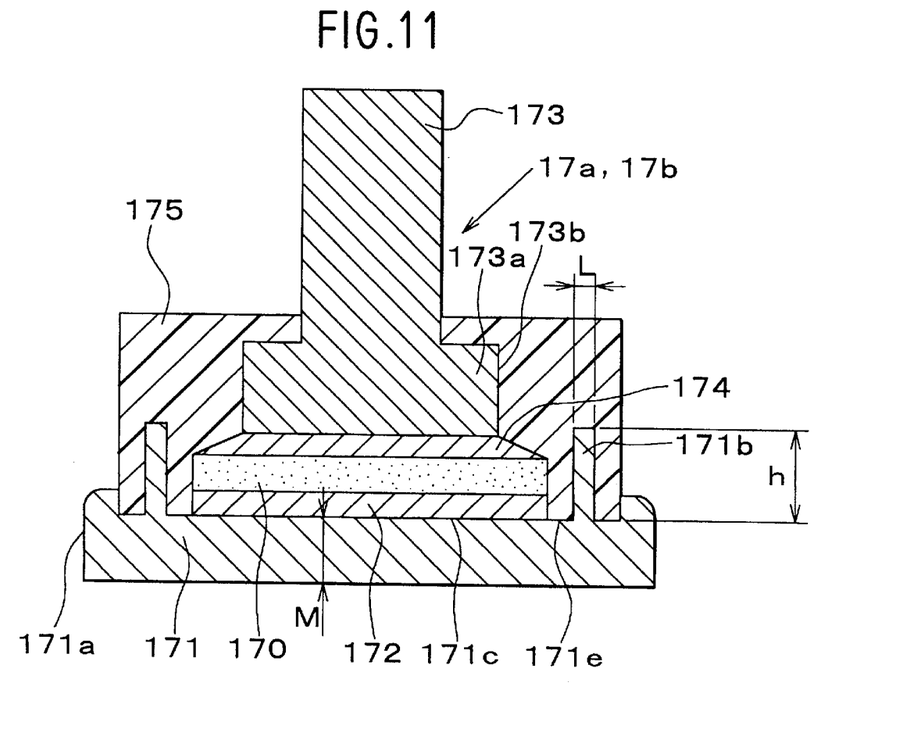
FIG. 11 is a cross-sectional view illustrating a rectifier according to an eighth embodiment of the present invention.

A rectifier according to an eighth embodiment is described with reference to FIG. 11. The annular wall 171b is extended axially to cover the chip 170 so that the insulating member 175 covers the wall 171b to provide tighter sealing effect as well as increased insulation effect like the third embodiment shown in FIG. 6.

In the foregoing description of the present invention, the invention has been disclosed with reference to specific embodiments thereof. It will, however, be evident that various modifications and changes may be made to the specific embodiments of the present invention without departing from the broader spirit and scope of the invention as set forth in the appended claims. Accordingly, the description of the present invention in this document is to be regarded in an illustrative, rather than restrictive, sense.

What is claimed is:

1. A sealed rectifier comprising:
   a semiconductor diode chip;
   base electrode made of conductive metal having a plate a central mount extending axially from said plate for supporting said chip thereon, and a wall extending axially from said plate to surround said mount, a space being defined between said mount and said wall, said wall and having a height greater than a height of said mount, said mount being electrically connected to one side of said chip;
   a pole electrode having a flange electrically connected to the other side of said chip; and
   an insulating member filled in said space between said central mount and said wall to cover said chip, base electrode and a portion of said pole electrode at a pressure higher than the atmospheric pressure, wherein
   said insulating member includes resinous material and inorganic filler material to provide internal pressure in said space, thereby reducing a difference in thermal expansion in a radial direction between said semiconductor diode chip and respective one of said base and pole electrodes.

2. A sealed rectifier as claimed in claim 1, wherein said insulating member includes more than 50 weight % of said inorganic filler material.

3. A sealed rectifier as claimed in claim 1, wherein said central mount has a height of about 1 mm from said plate.

4. A sealed rectifier as claimed in claim 1, wherein said insulating member has a glass transition temperature which is higher than about 40° C. below a maximum temperature of said rectifier in use.

5. A sealed rectifier as claimed in claim 4, wherein said insulating member has a glass transition temperature which is higher than a maximum temperature of said rectifier in use.

6. A sealed rectifier as claimed in claim 4, wherein said insulating member has a glass transition temperature which is higher than 140° C.

7. A sealed rectifier as claimed in claim 4, wherein said insulating member has a glass transition temperature which is higher than 180° C.

8. A sealed rectifier as claimed in claim 1, wherein said insulating member is disposed to cover said wall.

9. A sealed rectifier as claimed in claim 1, wherein said plate is secured to a cooling fin exposed to cooling air; and
   said wall is exposed to said cooling air directly.

10. A sealed rectifier as claimed in claim 9, wherein an outer periphery of said plate has a surface formed on a portion below said semiconductor diode chip to be press-fitted to said cooling fin.

11. A sealed rectifier as claimed in claim 10, wherein said surface of said plate is serrated.

12. A sealed rectifier as claimed in claim 1 further comprising a thin insulating layer covering said chip and connecting portions of said base electrode and pole electrode, wherein said insulating layer covering said base electrode around said mount is not higher than said mount.

13. A sealed rectifier as claimed in claim 1, wherein said insulating member has a coefficient of linear expansion which is larger than the coefficient of linear expansion of said base electrode and said pole electrode.

14. A sealed rectifier as claimed in claim 1, wherein said central mount has an outer periphery which is not smaller than an outer periphery of said diode chip.

15. A sealed rectifier as claimed in claim 1, wherein said flange of said pole electrode has an outer periphery which is not larger than an outer periphery of said diode chip.

16. A sealed rectifier as claimed in claim 1, wherein said rectifier is disposed in an alternator having a centrifugal fan and a cooling fin cooled by said fan; and
   said rectifier member is mounted on said cooling fin.

17. A sealed rectifier as claimed in claim 16, wherein said pole electrode is in a down stream side of said cooling air.

18. A sealed rectifier as claimed in claim 1, wherein said thickness L of said wall is between ½ and ⅙ of the thickness of said central mount.

19. A sealed rectifier comprising:
   a semiconductor diode chip;
   a base electrode made of conductive metal having a plate a central mount extending axially from said plate for supporting said chip thereon and a wall extending axially from said plate to a height grater than a height of said mount to surround the same with a space therebetween, said mount being electrically connected to one side of said chip;
   a pole electrode having a flange electrically connected to the other side of said chip; and
   an insulating mold disposed in said space between said central mount and said wall to cover said chip, base electrode and pole electrode at a pressure higher than the atmospheric pressure, wherein said plate has a surface for connection with an outside member; and said insulating mold is composed of resinous material and inorganic filler material of more than 50 weight % to provide residual internal pressure to generate internal pressure in said space, thereby reducing a difference in thermal expansion between said semiconductor diode chip and respective one of said base and pole electrodes.

20. A sealed rectifier comprising:

a semiconductor diode chip;

a base electrode made of conductive metal having a plate, a central mount extending axially from said plate for supporting said chip thereon, and a wall extending axially from said plate to cover said mount, said mount being electrically connected to one side of said chip;

a pole electrode having a flange electrically connected to the other side of said chip; and an insulating member disposed in a space between said central mount and said wall to cover said chip, base electrode and a portion of said pole electrode at a pressure higher than the atmospheric pressure, wherein said plate has a surface for connection with an outside member;

said insulating member is composed of resinous material and inorganic filler material and has a glass transition temperature higher than 140° C. and modulus of elasticity larger than 7000 Mpa.

21. A sealed rectifier comprising:

a semiconductor diode chips;

a base electrode made of conductive metal having a plate, a central mount extending axially from said plate for supporting said chip thereon and a wall extending axially from said plate to surround said mount with a space defined therebetween, said mount being electrically connected to one side of said chip;

a pole electrode having a flange electrically connected to the other side of said chip; and an insulating member disposed in the space between said central mount and said wall to cover said chip, base electrode and a portion of said pole electrode at a pressure higher than the atmospheric pressure, wherein a thickness L of said wall is smaller than a thickness M of said central mount;

said plate has a surface for connection with an outside member;

said insulating member is composed of resinous material and inorganic filler material of more than 50 weight % to provide internal pressure in said space, thereby reducing difference in thermal expansion in the radial direction between said semiconductor chip and respective one of said base and pole electrodes.

22. A sealed rectifier as claimed in claim 21 said insulating member is disposed to cover said wall.

23. A sealed rectifier as claimed in claim 1, wherein a thickness L of said wall is smaller than a thickness M of said central mount.

* * * * *